US008602592B2

(12) United States Patent
Kuchibhotla et al.

(10) Patent No.: US 8,602,592 B2
(45) Date of Patent: Dec. 10, 2013

(54) DIODE-LASER ILLUMINATOR WITH INTERCHANGEABLE MODULES FOR CHANGING IRRADIANCE AND BEAM DIMENSIONS

(75) Inventors: S. Krishna Kuchibhotla, San Jose, CA (US); Xing Ming Zheng, San Jose, CA (US)

(73) Assignee: Coherent, Inc., Santa Clara, CA (US)

( * ) Notice: Subject to any disclaimer, the term of this patent is extended or adjusted under 35 U.S.C. 154(b) by 107 days.

(21) Appl. No.: 13/082,171

(22) Filed: Apr. 7, 2011

(65) Prior Publication Data
US 2012/0257387 A1 Oct. 11, 2012

(51) Int. Cl.
*F21V 1/00* (2006.01)
*F21V 11/00* (2006.01)
*F21V 3/00* (2006.01)
*F21V 5/00* (2006.01)

(52) U.S. Cl.
USPC ........... 362/237; 362/227; 362/235; 362/236; 362/238; 362/239; 362/249.02; 362/311.02; 362/311.01

(58) Field of Classification Search
None
See application file for complete search history.

(56) References Cited

U.S. PATENT DOCUMENTS

| | | | |
|---|---|---|---|
| 5,900,981 A | 5/1999 | Oren et al. | |
| 6,771,686 B1 | 8/2004 | Ullman et al. | |
| 6,773,142 B2 | 8/2004 | Rekow | |
| 6,883,142 B2 * | 4/2005 | Shimamoto et al. | 715/744 |
| 7,016,393 B2 | 3/2006 | Anikitchev et al. | |
| 7,135,392 B1 | 11/2006 | Adams et al. | |
| 7,265,908 B2 | 9/2007 | Anikitchev | |
| 7,355,800 B2 | 4/2008 | Anikitchev | |
| 7,428,039 B2 | 9/2008 | Ferber | |
| 7,545,838 B2 | 6/2009 | Fontanella et al. | |
| 7,615,722 B2 | 11/2009 | Govorkov et al. | |
| 2008/0013182 A1 | 1/2008 | Ferber | |
| 2012/0057345 A1* | 3/2012 | Kuchibhotla | 362/237 |
| 2012/0199564 A1* | 8/2012 | Washko et al. | 219/121.63 |

FOREIGN PATENT DOCUMENTS

WO 2005/085934 A1 9/2005

OTHER PUBLICATIONS

Kuchibhotla, Sivarama Krishna, U.S. Appl. No. 12/967,330, filed Dec. 14, 2010, titled "Line-Projection Apparatus for Arrays of Diode-Laser Bar Stacks", 30 pages.
International Search Report and Written Opinion received for PCT Patent Application No. PCT/US2011/049706, mailed on Dec. 9, 2011, 9 pages.
Written Opinion received for PCT Patent Application No. PCT/US2012/031732, mailed on Oct. 2, 2012, 5 pages.
International Search Report received for PCT Patent Application No. PCT/US2012/031732, mailed on Oct. 2, 2012, 4 pages.

(Continued)

*Primary Examiner* — Natalie Walford
(74) *Attorney, Agent, or Firm* — Morrison & Foerster LLP

(57) ABSTRACT

Projection apparatus for projecting a radiation spot on a working plane includes a plurality of stacks of diode-laser bars. Each stack provides a beam of laser radiation. The diode-laser bars in each stack are arranged one above another in the fast-axis direction of the diode-laser bars. A corresponding plurality of beam-expanders expands the beam from the corresponding diode-laser bar stack in the slow-axis direction of the diode laser bars only. A focusing lens collects the slow-axis expanded beams and projects the slow-axis expanded beams into the working plane to form the radiation spot.

18 Claims, 15 Drawing Sheets

(56) References Cited

OTHER PUBLICATIONS

Bayer et al., "Beam Shaping of Line Generators Based on High Power Diode Lasers to Achieve High Intensity and Uniformity Levels", Proc. of SPIE, vol. 7062, 2008, pp. 70620X-I-70620X-7.

Huang et al., "Laser Diode End-Pumped Efficient Coupling System Based on Microlens Arrays", Proc. of SPIE, vol. 7506, 2009, pp. 75061E-1-75061E-5.

Kohler et al., "11-kW Direct Diode Laser System with Homogenized 55 × 20 mm2 Top-Hat Intensity Distribution", Proc. of SPIE, vol. 6456, 2007, pp. 64560O-1-64560O-12.

International Preliminary Report on Patentability received for PCT Patent Application No. PCT/US2011/049706, mailed on Mar. 21, 2013, 7 pages.

Non-Final Office Action received for U.S. Appl. No. 12/967,330, mailed on May 16, 2013, 9 pages.

\* cited by examiner

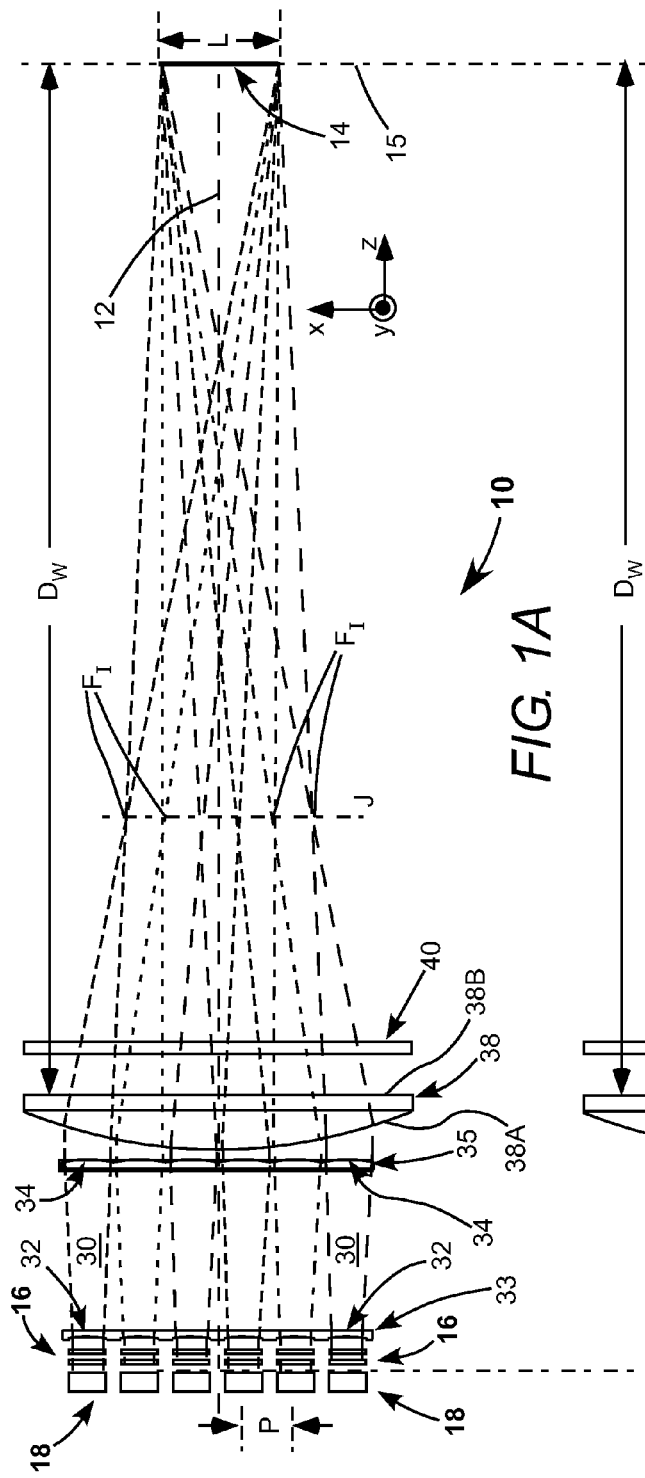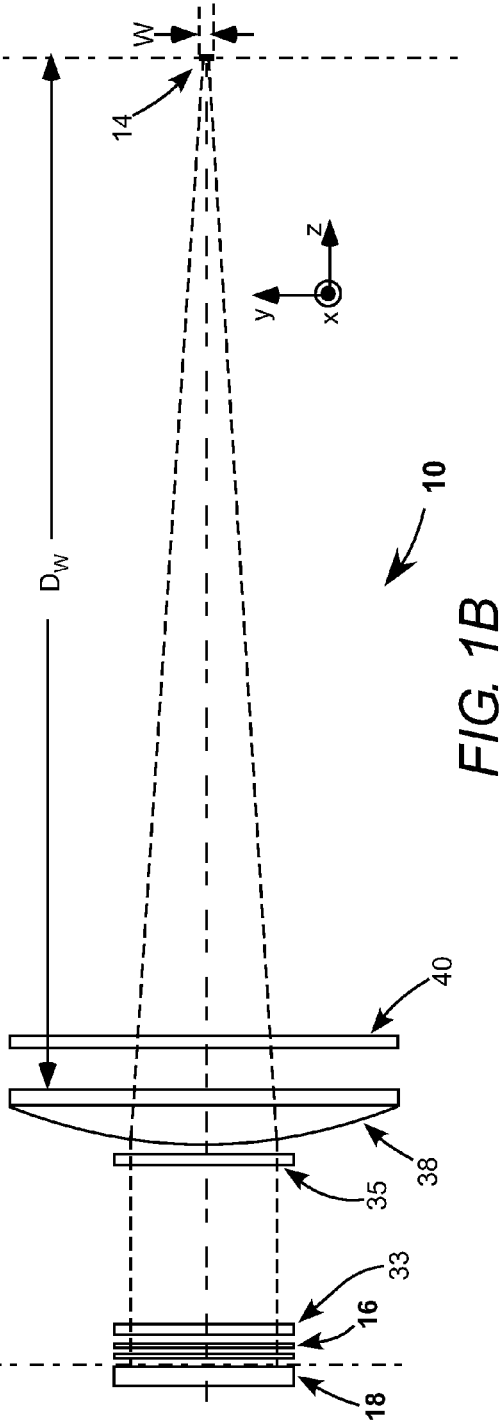

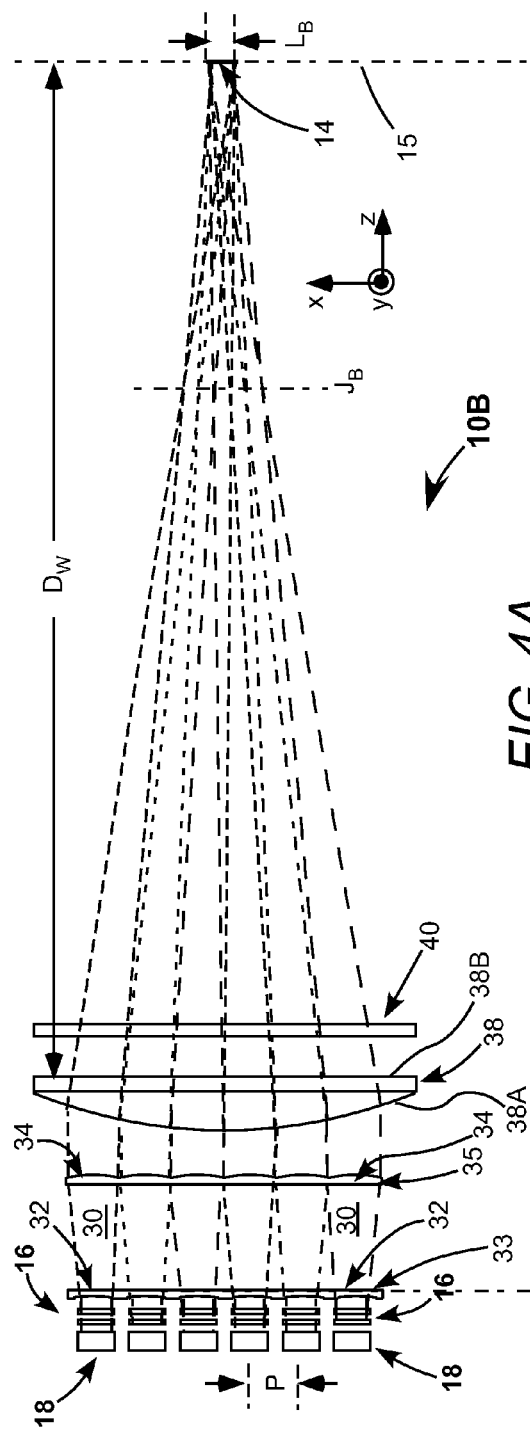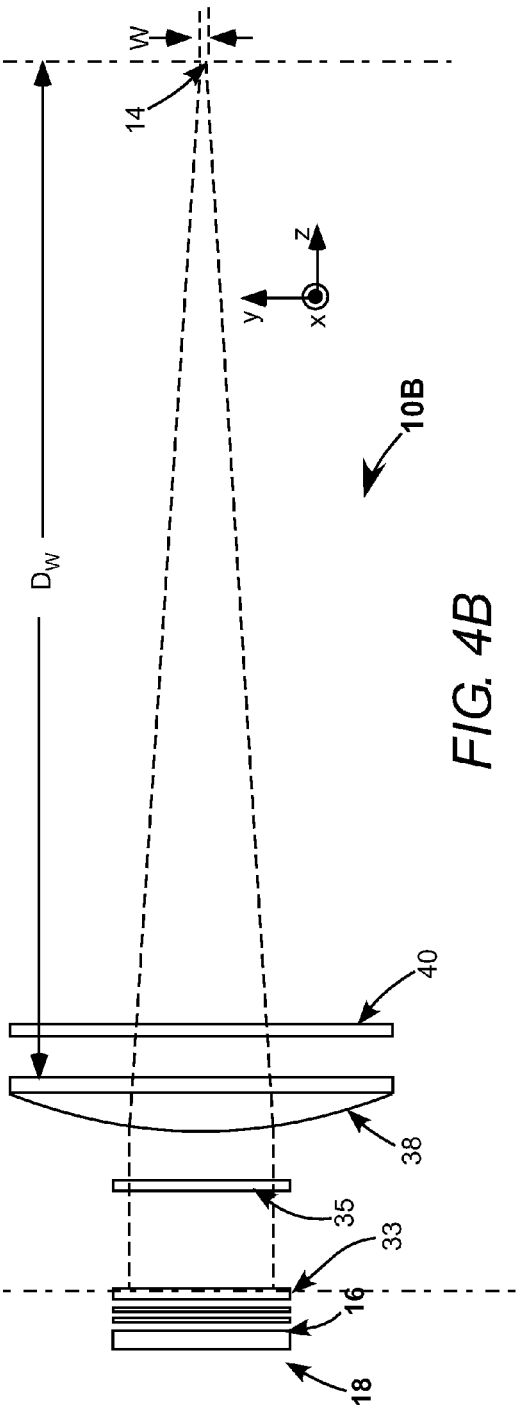

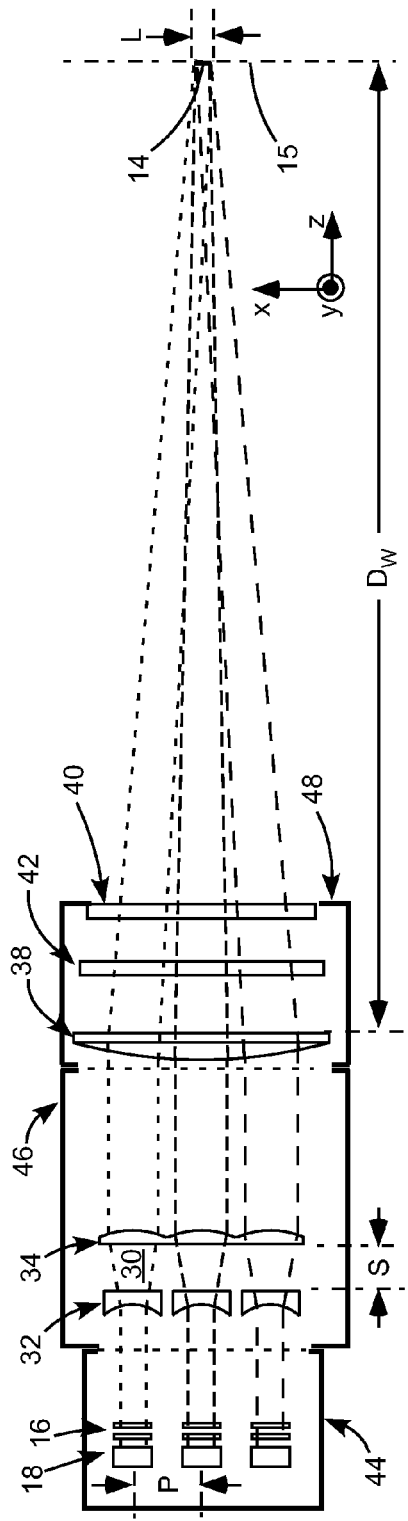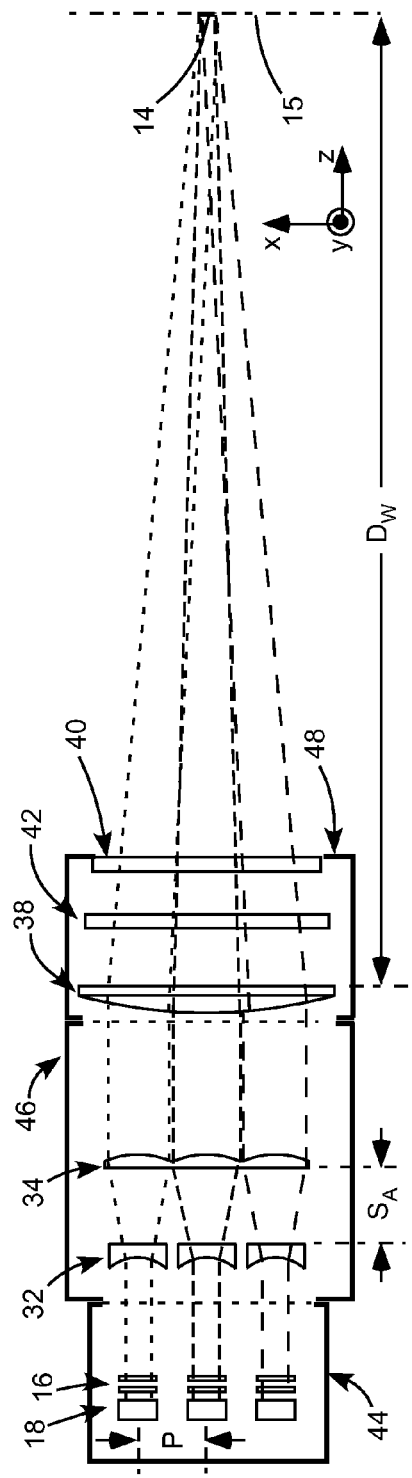

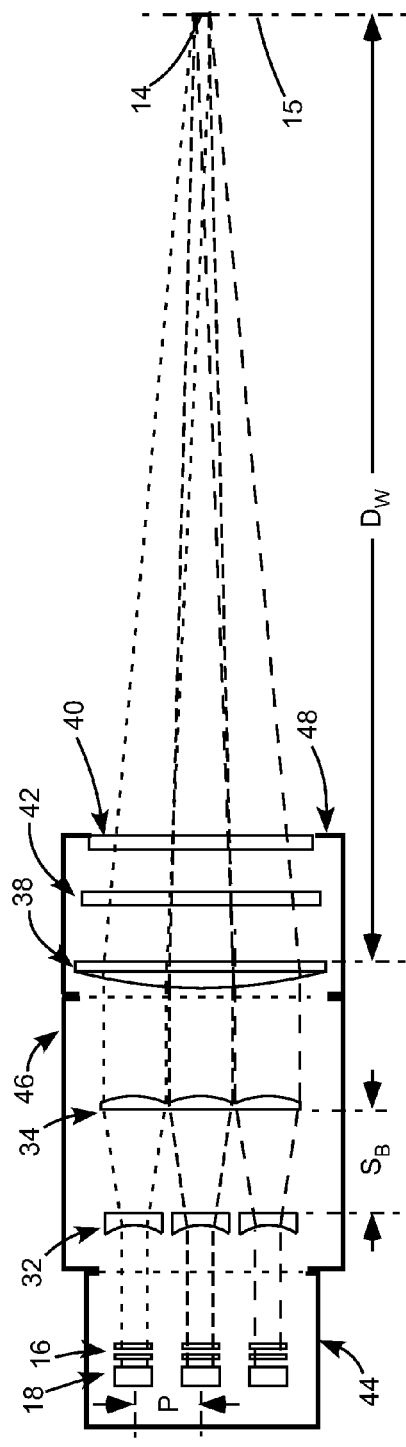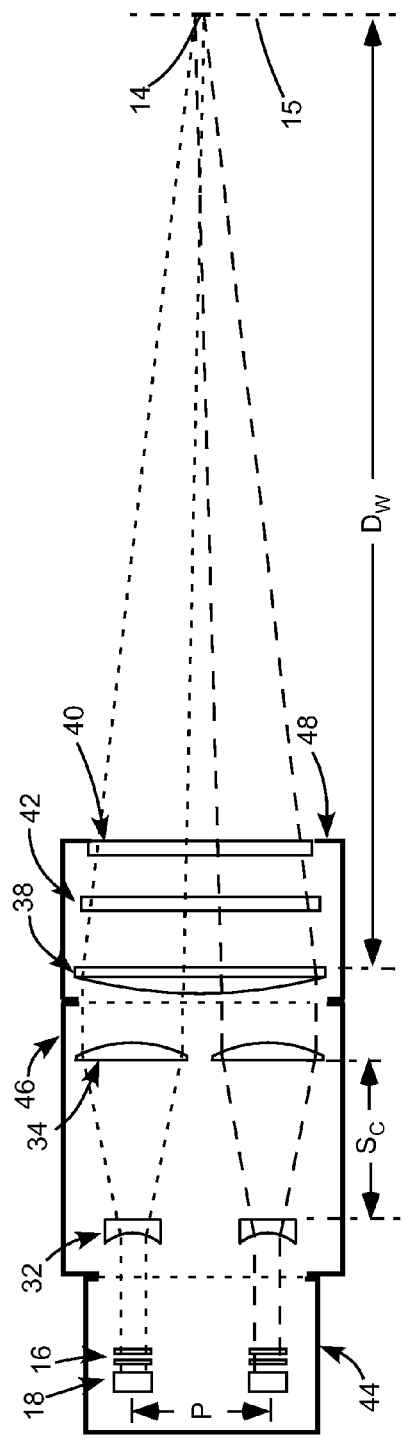
FIG. 7
FIG. 8

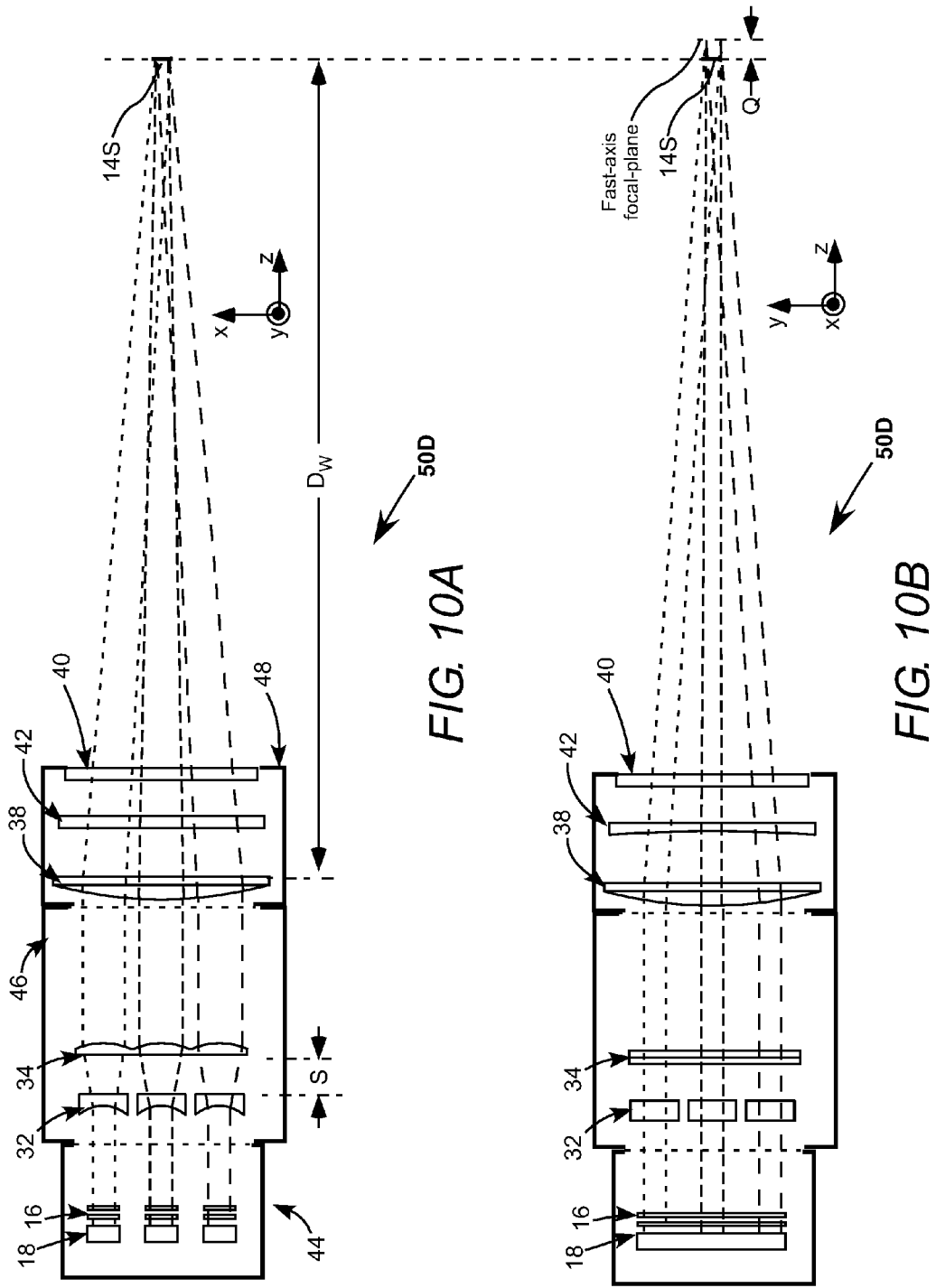

DIODE-LASER ILLUMINATOR WITH INTERCHANGEABLE MODULES FOR CHANGING IRRADIANCE AND BEAM DIMENSIONS

TECHNICAL FIELD OF THE INVENTION

The present invention relates in general to optical apparatus for projecting the output of one or more lasers into a spot of predetermined dimensions such as a line having a predetermined width and height. The invention relates in particular to apparatus for projecting such a spot from the output of a plurality of fast-axis diode-laser-bar stacks.

DISCUSSION OF BACKGROUND ART

There are several applications for laser radiation projected to form a line of light on a target. Early versions of such line-projection apparatus for diode-lasers were found in bar-code readers and the like. Here, however, uniformity of illumination along the line was at most a secondary consideration.

Later versions of diode-laser line projection apparatus were developed for spatial light modulators (SLMs) in laser printers, image projectors, and the like. Here, power in the line of light was not required to be very high, and could be delivered by a simple one-dimensional laser array, commonly referred to as a diode-laser bar. Uniformity of illumination along the line of light in these applications is important. An "ideal" line of radiation requires a Gaussian intensity distribution of intensity in the width of the line and a uniform or "flat-top" distribution along the length of the line. This uniformity requirement encouraged the invention of projection optics that would provide adequate uniformity. Examples of such projection optics are described in U.S. Pat. No. 6,773,142, U.S. Pat. No. 7,016,393, U.S. Pat. No. 7,265,908, and U.S. Pat. No. 7,355,800, all of which are assigned to the assignee of the present invention.

A recent application for projecting a spot of a predetermined length-to-width ratio is laser cladding. In laser cladding, a durable protective layer is formed on a surface by depositing the layer material in powder form on a surface while simultaneously irradiating the powder covered surface with laser radiation to melt the powder which flows, then hardens on the surface to form the layer. The powder and radiation source moves over the surface while the layer is being formed. More laser power provides that a faster layer-forming speed can be achieved for any given spot dimension. A typical spot would have a width of about 1.0 mm and length between about 3.0 mm and 30.0 mm, with between about 2 and 8 kilowatts (kW) total power delivered into the spot.

The spot would preferably have Gaussian distribution of intensity in the spot width, and a uniform ("flat top") distribution in the spot length. Depending on the optical efficiency of the illuminating apparatus, this would require a diode-laser source with a total power possibly in excess of about 3 kW. As the power available from a typical multimode diode-laser bar is only on the order of 70 Watts (W), such a 3 kW-source would require about 50 diode-laser bars. In order to provide 7 kW, 100 diode-laser bars would be required.

In many instances a user of cladding apparatus may have a requirement for different spot-shapes for different cladding operations, and possibly even for different power in a spot having a fixed size. At present this requires a different projector for each different spot shape. It would be convenient and cost effective to have one projector capable of projecting all of the necessary different spot shapes, preferably with variable power. The spots should be projectable at the same working distance in the projector.

SUMMARY OF THE INVENTION

The present invention is directed to optical apparatus for projecting radiation into a spot of predetermined length and width in a working plane. In one aspect the apparatus comprises a plurality of stacks of diode-laser bars. Each stack is arranged to provide a beam of laser radiation. The diode-laser bars have a length, a slow-axis aligned with the length, a fast-axis perpendicular to the slow-axis, and a propagation-axis perpendicular to the fast-axis and the slow-axis. The diode-laser bars in each stack are arranged one above another in the fast-axis direction. A corresponding plurality of beam-expanders is provided, one for each of the diode-laser bar stacks. Each of the beam-expanders is arranged to expand the beam from the corresponding diode-laser bar stack in the slow-axis direction only. An optical arrangement including a spherical focusing lens is arranged to collect the slow-axis expanded beams and project the slow-axis expanded beams into the working plane to form the length of the radiation spot.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

FIG. 1A is a slow-axis view schematically illustrating a preferred embodiment of optical apparatus in accordance with the present invention arranged to project a line of radiation having a length of about 30 millimeters and a width of about 1 mm, the apparatus including six fast-axis diode-laser bar stacks aligned along the slow-axis, each stack having an array of fast-axis collimators and an array of slow-axis collimators, six inverse Galilean beam-expanders, one for each diode-laser bar stack, arranged to expand only in the slow-axis only, and a common focusing lens having optical power in the fast-axis and the slow-axis and arranged to spread beams from the diode-laser bar stacks in the slow-axis in a plane at a predetermined working distance from the lens to form the length of the line and focus the beams in the fast-axis in the plane to form the width of the line.

FIG. 1B is a fast-axis view schematically illustrating further detail of the apparatus of FIG. 1A.

FIG. 4A is a slow-axis view schematically illustrating an example of optical apparatus in accordance with the present invention arranged to project a line of radiation having a length of about 5 millimeters and a width of about 1 mm, the apparatus is similar to the apparatus of FIG. 1A but with another different configuration of the inverse Galilean beam-expanders.

FIG. 4B is a fast-axis view schematically illustrating further detail of the apparatus of FIG. 4A.

FIG. 5 is a slow-axis view schematically illustrating another preferred embodiment of optical apparatus in accordance with the present invention similar to the apparatus of FIG. 1A but including only three diode-laser arrays and associated collimators and arranged to project a 6 mm by 1 mm beam in the working plane, the apparatus further including a cylindrical negative lens cooperative with the focusing lens for extending beam width in the fast-axis to determine the Y-dimension, and comprising an assembly of three modules with a first module containing three diode-laser bar stacks and associated collimating lens arrays, a second module containing the inverse Galilean beam-expanders, and a third module including the focusing lens and the cylindrical negative lens, with the beam-expanders being interchangeable in the second module and the cylindrical negative lens being interchangeable in the third module.

FIG. 6 is a slow-axis view schematically illustrating an example of the apparatus of FIG. 5 but arranged to project a 5 mm by 1 mm beam.

FIG. 7 is a slow-axis view schematically illustrating an example of the apparatus of FIG. 5 but arranged to project a 4 mm by 1 mm beam.

FIG. 8 is a slow-axis view schematically illustrating an example of the apparatus of FIG. 5 but including only two diode-laser bar stacks and arranged to project a 3 mm by 1 mm beam.

FIG. 10A and FIG. 10B are respectively slow-axis and fast-axis views schematically illustrating the apparatus of FIG. 5 arranged to project a 6 mm by 6 mm beam in the working plane.

DETAILED DESCRIPTION OF THE INVENTION

Figure 1C:
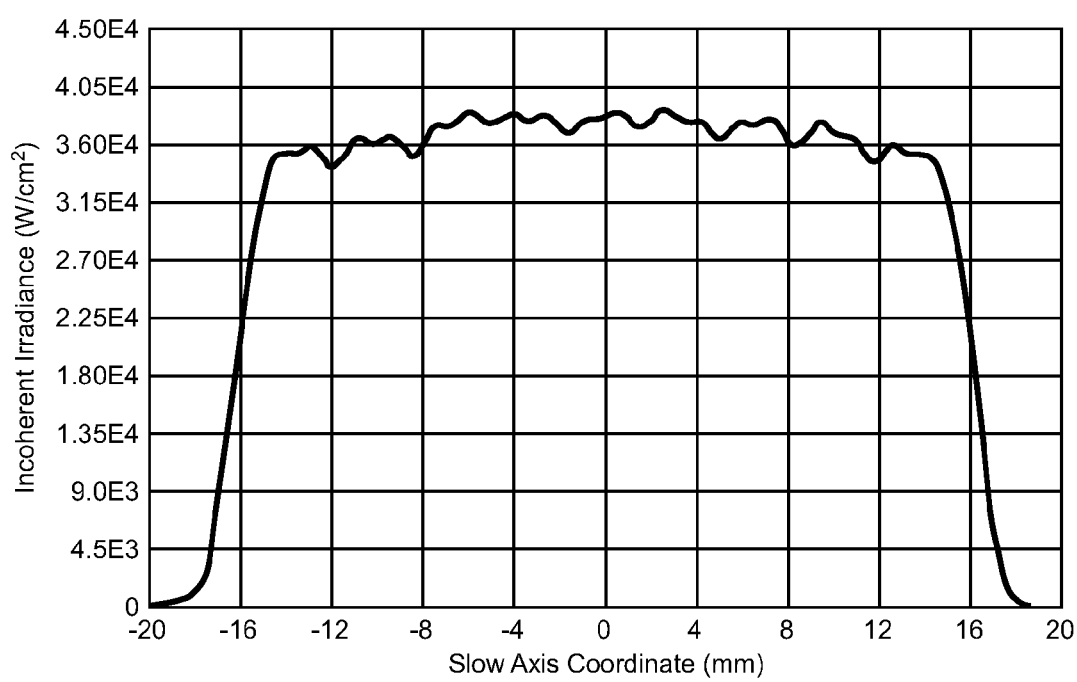
FIG. 1C is a graph schematically illustrating calculated irradiance as a function of slow-axis coordinate in the working plane of the apparatus of FIG. 1A.

Referring now to the drawings, wherein like components are designated by like reference numerals, FIG. 1A and FIG. 1B are respectively slow-axis fast-axis views of a preferred embodiment 10 of optical apparatus in accordance with the present invention. Apparatus 10 has a system optical axis 12. Apparatus 10 includes six diode-laser bar stacks 18 with a fast-axis and slow-axis collimating arrangement 16 associated with each diode-laser bar stack.

Figure 2A:
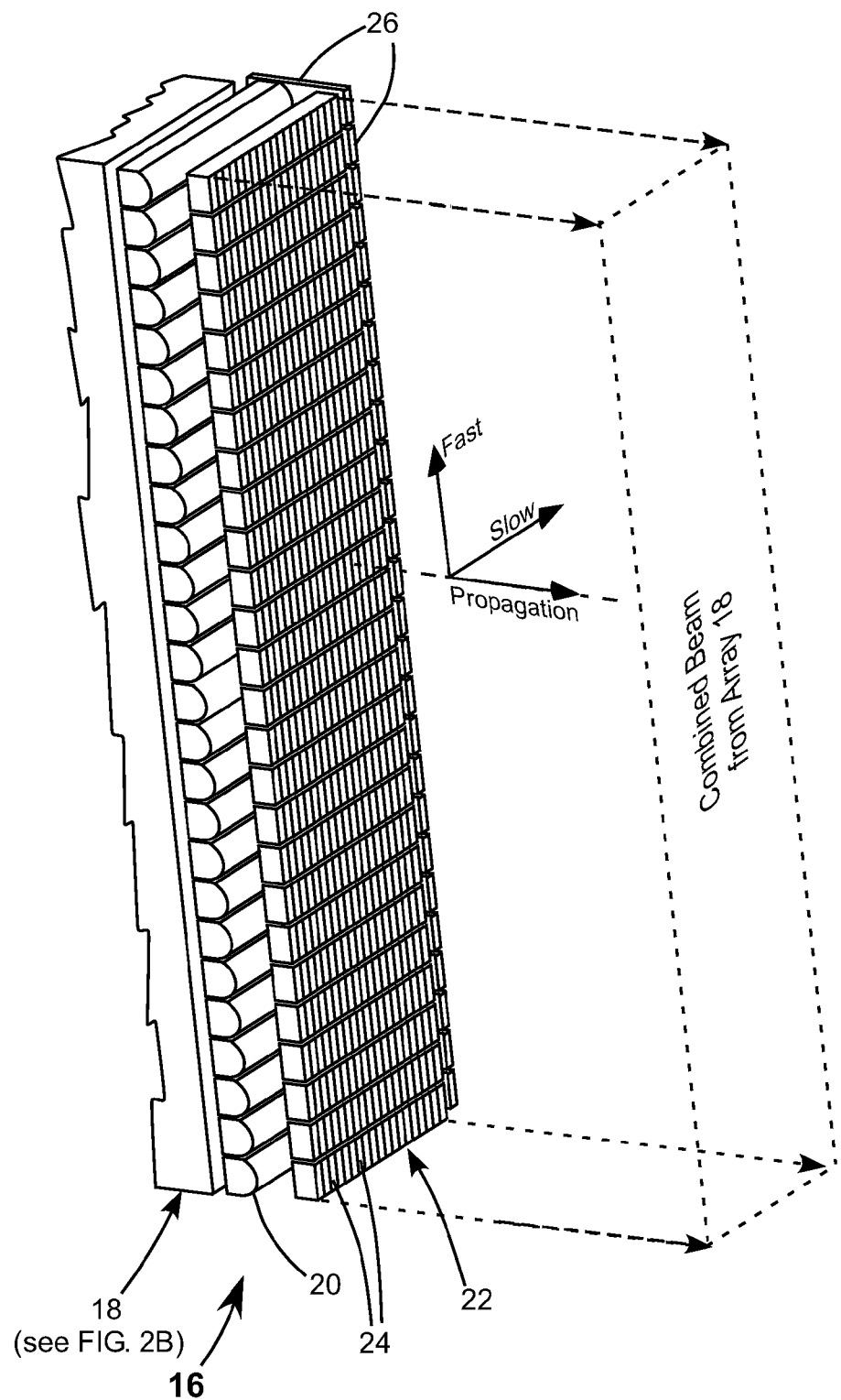
FIG. 2A is an isometric view illustrating details of the fast-axis and slow-axis collimators for a diode-laser bar stack of the apparatus of FIG. 1A.
Figure 2B:
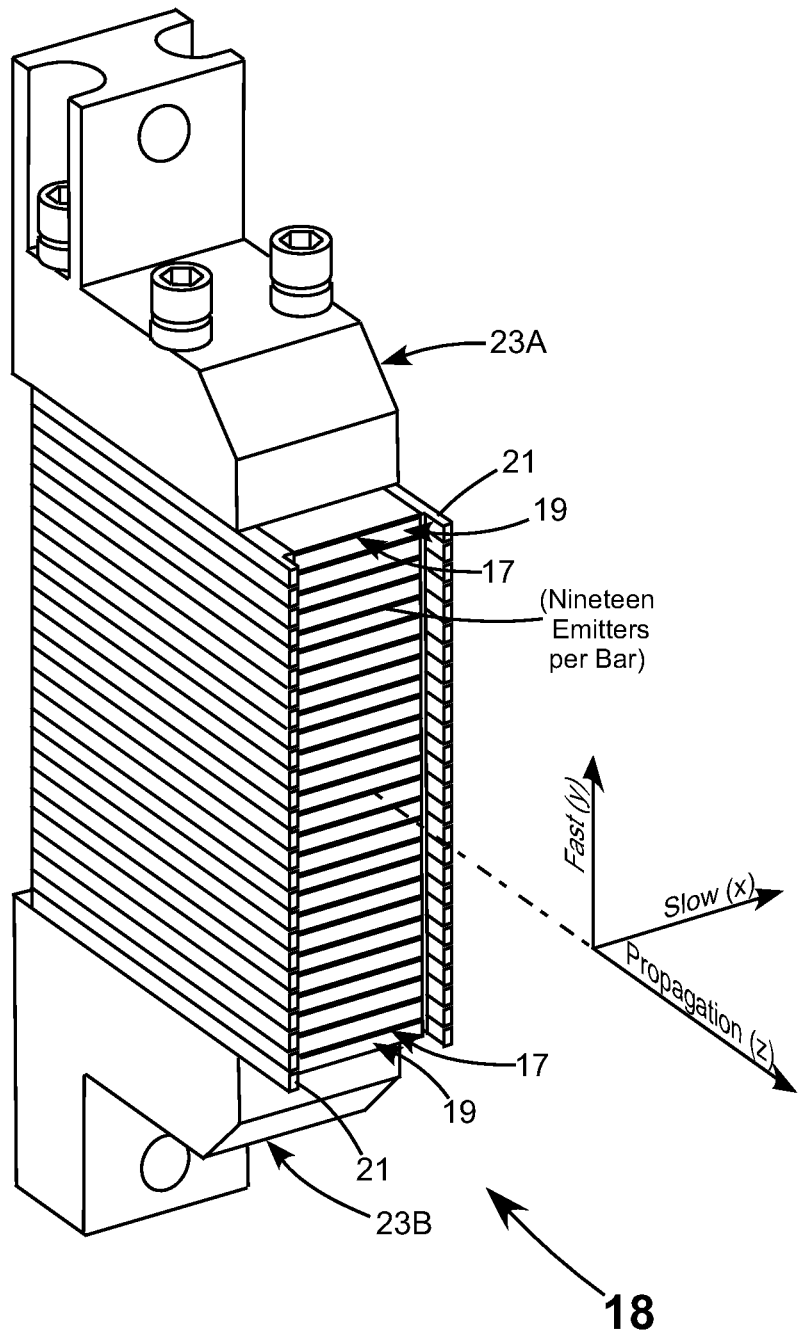
FIG. 2B is an isometric view schematically illustrating details of a fast-axis diode-laser bar stack in the apparatus of FIG. 1A.

The apparatus is described with reference to an x, y, and z Cartesian axis-system with the x-axis and y-axis corresponding to respectively the slow-axis and fast-axis of diode-laser bars in the stacks. System optical axis 12 is parallel to the emission- or propagation-axis (z-axis) direction of the diode-laser bar stacks. Apparatus 10 as depicted and appropriately scaled is arranged to project a line of radiation 14 in a working plane 15 with the line having a length L of about 30.0 millimeters and a width W of about 1.0 mm. The z-axis separation of optical elements is approximately relatively to scale. Before proceeding with further description of the configuration and arrangement of elements, a description of the diode-laser bar stacks and associated collimating arrangements is set forth with reference to FIG. 2A and FIG. 2B FIG. 2A is a three-dimensional view schematically illustrating details of diode-laser module 16. The module includes a fast-axis diode-laser bar stack 18 here assumed to be a stack of twenty-six (26) diode-laser bars. Details of one-example of the stack construction are depicted in FIG. 2B. Here, each diode-laser bar 17 is mounted on the front of a corresponding heat sink member 19. The heat-sink members are clamped together between clamping and mounting blocks 23A and 23B. Each heat-sink member has a forward extending portion 21 to which a fast-axis collimating (FAC) lens or a module including a FAC lens and a slow-axis collimating (SAC) lens array can be attached. A 26-bar stack such as stack 18, with nineteen emitters per bar, can deliver radiation having a total power of about 1.4 kW. Diode-laser bar stacks of this type are commercially available from Coherent Inc. of Santa Clara, Calif.

Referring again to FIG. 2A, each of the diode laser bars has a dedicated cylindrical fast-axis collimating (FAC) lens 20, which, as the name suggests, collimates light from each emitter in the bar in the highly divergent fast-axis direction. In the illustrated embodiment, there are twenty-six lenses 20. Spaced apart from each FAC lens in the z-axis direction is an array 22 of cylindrical slow-axis collimating (SAC) lenses 24. The number of lenses 24 in each array 22 corresponds with the number of spaced-apart emitters (diode-lasers) in each of the diode-laser bars. Here, it is assumed that there are nineteen (19) emitters in each bar. Each SAC lens is aligned with a corresponding emitter. The FAC lenses and SAC lens-arrays are held in alignment with each other by brackets 26 (shown on only one side in FIG. 2 for convenience of illustration). Assemblies of FAC and SAC lenses are available from several commercial suppliers.

The FAC and SAC lenses are preferably spaced apart in the z-axis by a distance just sufficient to allow the slow-axis diverging beam from each emitter to almost fill a corresponding SAC lens 24. This distance will depend in any example on the actual divergence, and the emitter-width and spacing (the so-called fill-factor). In the example under consideration, it is assumed that the emitter width is 100.0 µm, the emitter pitch is 0.5 mm, and the spacing between the FAC and SAC lenses is 3.0 mm.

It is pointed out here that collimation of the light from the diode laser emitters will never be perfect. This is due, inter alia, to the relatively poor beam-quality of a beam from a diode-laser emitter, the relative simplicity of the collimating lenses and to misalignment of emitters in any bar along the slow-axis, this misalignment being a manufacturing artifact, whimsically referred to by practitioners of the art as "smile". This "smile" will vary from bar to bar. It should also be noted that while collimating in the fast-axis is always necessary, in certain configurations, slow-axis collimation may be omitted in view of the relatively low divergence in this axis. Eliminating the SAC array saves cost at some expense in reduced performance.

Referring again to FIG. 1A and FIG. 1B, apparatus 10 includes six inverse Galilean beam-expanders 30 spaced apart in the slow-axis with one aligned with a corresponding one of each of the collimating arrays of the diode-laser bar stack. Each beam-expander includes a cylindrical negative lens 32 and a cylindrical positive lens 34 listed in numerical order in the propagation direction of radiation through the apparatus. The negative lenses 32 are aligned in the slow-axis direction and in this example are formed in an array 33 thereof. Similarly lenses 34 are aligned in the slow-axis direction and formed into an array 35 thereof. As the lenses are cylindrical, each telescope expands a beam in the slow-axis only leaving the fast-axis dimension of the beam unchanged.

It should be noted here that in this description and the appended claims the term "cylindrical" as applied to lenses or lens elements means only that the lenses have power in only one of two transverse axes (the fast-axis or the slow-axis). The term does not mean that power-providing surfaces are necessarily sections of circular cylinders. Some departure from circularity may be provided if that is deemed convenient. Similarly the term "spherical" applied to a surface of a lens or lens element means only that the lens has equal power in both transverse axes. The surface may include some measure of asphericity without departing from the spirit and scope of the present invention. The term "lens" applies to a lens having one or more elements to produce a desired power.

Continuing with reference to FIG. 1A, six expanded beams, one from each beam-expander, are collected by a focusing lens 38 having a convex entrance surface 38A and a plane exit surface 38B. Focusing lens 38 focuses the beams in the fast-axis in working plane 15 at a working distance $D_W$ from the lens, thereby defining the width W of a line, or elongated spot, of radiation 14. The inverse Galilean beam-expanders are configured such that the expanded beams each brought to corresponding intermediate foci $F_1$ slow-axis spaced-apart and about slow-axis aligned in a plane J. The beams then diverge to spread and overlap each other in plane 15, symmetrically about axis 12, thereby defining the length L of line 14.

In an example for forming a line 14 having a length L of about 30.0 mm and a width W of 1.0 mm lenses 32 and 34 of the beam-expanders have radii of curvature of −80.0 mm and +40.0 mm respectively. The lenses are spaced in the z-axis direction by 50.0 mm. Surface 38A of lens 38 has a radius of curvature of 160.0 mm and is axially spaced 46.0 mm from lens array 35. Spacing P between adjacent diode-laser array stacks is set to 16.0 mm. Lens 38 has an axial (vertex) thickness of 16.0 mm and working plane 15 is axially spaced by a distance $D_W$ of about 325.0 mm from plane surface 38B of the lens.

In a preferred embodiment, a plane parallel window 40 is provided to protect the upstream optics from dust and debris.

FIG. 1C is a graph schematically calculated illustrating irradiance as a function of slow-axis coordinate in the working plane of the apparatus of FIG. 1A. The radii of curvature and spacings are as assumed above. It is assumed for the ray traces and irradiance that each diode-laser bar stack has a total output of 1.4 kW.

It should be noted here that all ray trace diagrams and irradiance calculations herein were generated using ZEMAX optical design software available from ZEMAX Corporation of Bellevue, Wash. It should also be noted that in apparatus 10, while it is assumed that lenses in arrays 33 and 35 thereof are identical, which is convenient from a manufacturing point of view, each beam-expander may be individually and differently configured to provide a particular irradiance distribution in the working plane. It should further be noted that while inverse Galilean configurations are preferred for beam-expanders 30 other configurations are possible. Those skilled in the optical design art may design such configurations, using the above referenced or similar commercially available software, without departing from the spirit and scope of the present invention.

Figure 3A:
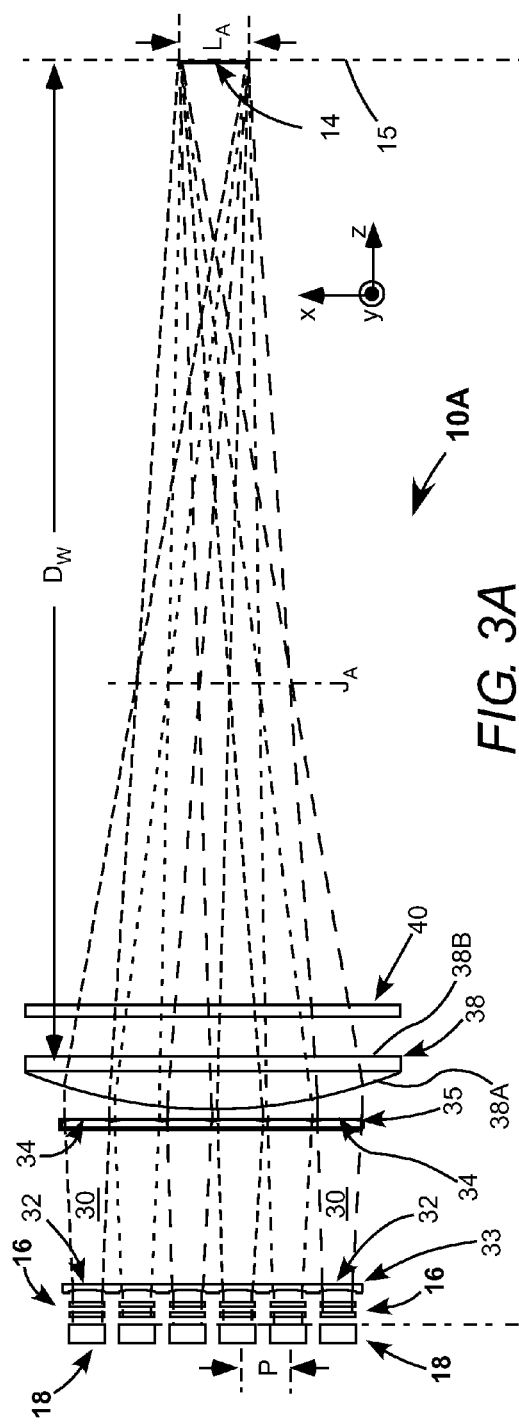
FIG. 3A is a slow-axis view schematically illustrating an example of optical apparatus in accordance with the present invention arranged to project a line of radiation having a length of about 12 millimeters and a width of about 1 mm, the apparatus is similar to the apparatus of FIG. 1A but with a different configuration of the inverse Galilean beam-expanders.
Figure 3B:
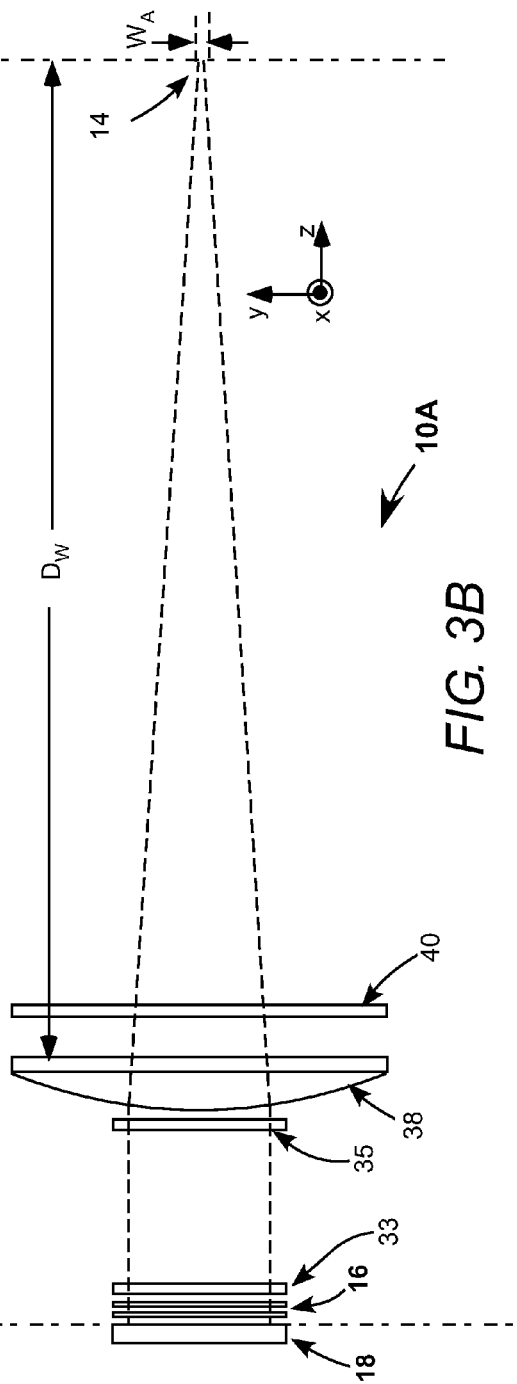
FIG. 3B is a fast-axis view schematically illustrating further detail of the apparatus of FIG. 3A.

FIG. 3A and FIG. 3B are respectively slow-axis and fast-axis views schematically illustrating an example 10A of optical apparatus in accordance with the present invention arranged to project a line of radiation $L_A$ having a length of about 12.0 millimeters and a width of about 1.0 mm. The apparatus is similar to the apparatus of FIG. 1A but with a different configuration of the inverse Galilean beam-expanders. This different configuration essentially fills the aperture of each lens 34 of the inverse Galilean beam-expanders and moves the plane of the intermediate foci, here designated as plane $J_A$, further toward working plane 15 than in apparatus 10, which has an effect of reducing the beam spread and correspondingly shortening the line length.

In the example for forming a line 14 having a length L of about 12.0 mm and a width W of 1.0 mm, lenses 32 and 34 of the beam-expanders have radii of curvature of −50.0 mm and +54.5 mm respectively. The lenses are spaced in the z-axis direction by 40.0 mm. The array stack spacing P, and specifications of focusing lens 38 and accordingly working distance $W_D$, which is determined by the fast-axis back focal length of the lens, are the same as in the example of FIGS. 1A and 1B.

Figure 3C:
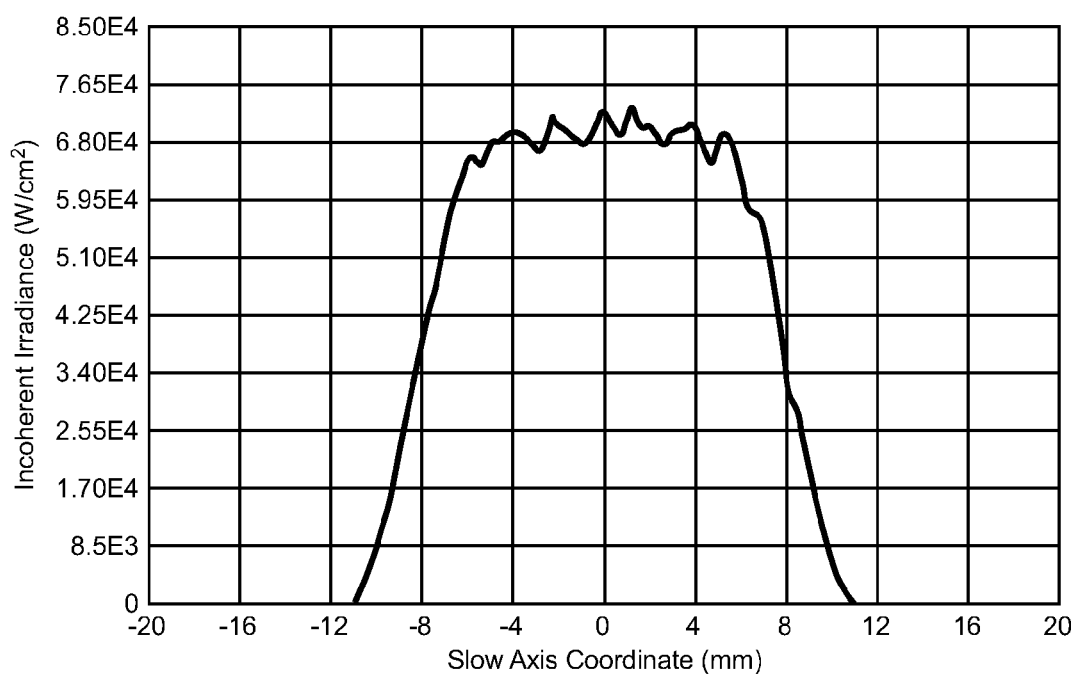
FIG. 3C is a graph schematically illustrating calculated irradiance as a function of slow-axis coordinate in the working plane of the apparatus of FIG. 3A.

FIG. 3C is a graph schematically illustrating calculated irradiance as a function of slow-axis coordinate in the working plane of the apparatus of FIG. 3A. The radii of curvature and spacings are as assumed above. It is assumed that each diode-laser bar stack has a total output as in the example of FIG. 1C. A result of this is that the peak irradiance is almost twice that of the example of FIG. 1C due to the reduced line-length.

FIG. 4A and FIG. 4B are respectively slow-axis and fast-axis views schematically illustrating another example 10A of optical apparatus in accordance with the present invention arranged to project a line of radiation $L_A$ having a length of about 5 millimeters and a width of about 1 mm. The apparatus is similar to the apparatus of FIG. 3A but with a different configuration of the inverse Galilean beam-expanders. This different configuration essentially fills the aperture of each lens 34 of the inverse Galilean beam-expanders and moves the plane of the intermediate foci, here designated as plane $J_B$, even further toward working plane 15 than in apparatus 10, which has an effect of further reducing the beam spread and correspondingly further shortening the line length.

In this example for forming a line 14 having a length L of about 5.0 mm and a width W of 1.0 mm, lenses 32 and 34 of the beam-expanders have radii of curvature of −20 mm and +35 mm respectively. The lenses are spaced in the z-axis direction by 30.0 mm. Here again, the array stack spacing P, and the specifications of focusing lens 38 and accordingly working distance $W_D$, which is determined by the fast-axis back focal length of the lens, are the same as in the example of FIGS. 1A and 1B.

Figure 4C:
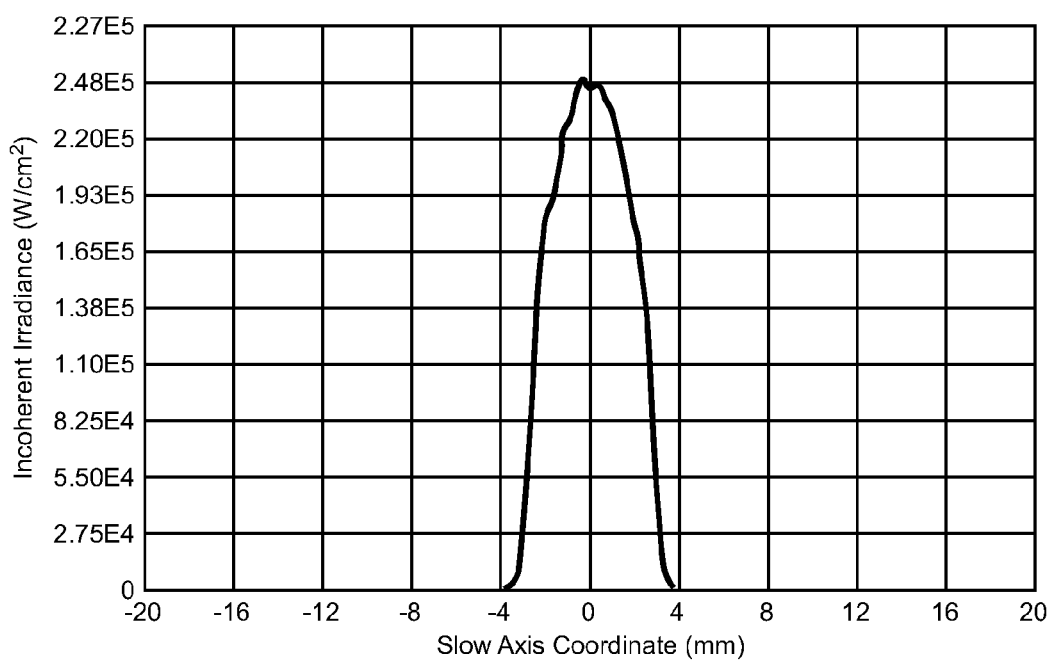
FIG. 4C is a graph schematically illustrating calculated irradiance as a function of slow-axis coordinate in the working plane of the apparatus of FIG. 4A.

FIG. 4C is a graph schematically illustrating calculated irradiance as a function of slow-axis coordinate in the working plane of the apparatus of FIG. 4A. The radii of curvature and spacings are as assumed above. Again it is assumed that each diode-laser bar stack has a total output as in the example of FIG. 1C. A result of this is that the peak irradiance is more than twice that of the example of FIG. 3C due to the reduced line-length.

The examples of the present invention described above are primarily useful for projecting a line, or an elongated spot, of radiation having a length between about 5.0 mm and about 30.0 mm or greater and a width of about 1.0 mm. Set forth below is a description of a modular embodiment of the inventive apparatus that allows user reconfiguration to project radiation into a generally rectangular spot having a length selectable between about 3.0 mm and about 6.0 mm and a width selectable between about 1.0 mm and about 6.0 mm.

FIG. 5 is a slow-axis view schematically illustrating an example 50 of the modular embodiment of the inventive apparatus. Apparatus 50 includes only three diode-laser bar stacks 18 and associated FAC and SAC arrays. The diode-laser stacks are about equally spaced along the slow-axis with a distance P between extreme ones of the stacks. There are three inverse Galilean beam-expanders 30 each including a cylindrical negative lens 32 followed by a cylindrical positive lens 34. As in examples described above these lenses have optical power in the slow-axis only. The beam-expanders, here, are arranged and configured to expand the total beam for the associated diode-laser bar stack in the slow-axis and to collimate the beam in the slow-axis. The beams from the diode-laser bar stacks are unaffected by the beam-expanders in the fast-axis, and are already collimated by the FAC lens arrays of the diode-laser bar stacks.

Apparatus 50 includes a focusing lens 38 followed by a cylindrical lens 42 having (negative) optical power in the fast-axis only. This cylindrical negative lens is followed by protective window 40. Lens 38 focuses the three expanded and collimated total beams from the diode-laser arrays in the slow-axis with the three focused beams overlapping to form the length of line 14. In this arrangement, the greater the slow-axis dimension of the beam at lens 38 the shorter will be the line-length L.

In the absence of any fast-axis optical power in lens 42, lens 38 will project the beams in the fast-axis such that the fast axis focus of lens 38 is about in working plane 15 to provide a line width W of about 1.0 mm, as in above-described examples of FIGS. 1A-B, 3A-B, and 4A-B. Increasing negative power in lens 42 will increase the line width in plane 15 by locating the fast-axis focal plane of the combination of the spherical lens and the cylindrical lens at a distance Q beyond the working plane.

If only the minimum beam-width is required, lens 42 can be replaced by a plane-plane element or omitted altogether, as the difference in focal-plane location with and without the thickness of the plane-plane element will be a small fraction of the focal depth. The terminology "focused in about" (a particular location or plane) as used in this description and the appended claims takes into account that there is a depth of focus for all focusing arrangements.

As noted above, the embodiment 50 is designed to be user reconfigurable to provide different line-dimensions, and even different power-density (irradiance), with the same basic apparatus and the same working distance $D_W$. To this end, diode-laser bar stacks 18 and associated FAC and SAC arrays are located in a first module 44; the inverse Galilean beam-expanders are incorporated in a second module 46; and focusing lens 38 cylindrical lens 42 and window 40 are located in a third module 48.

The z-axis position of lenses 32 in module 46 is fixed. Varying the spacing S between lenses 34 and lenses 32 and changing the lens curvatures is used to vary the slow-axis beam dimensions at lens 38. The power of lens 38 is the same whatever the desired line width, for fixing the working distance $D_W$. The set of lenses 32 and 34 forming the inverse Galilean beam-expanders can be assembled on a cartridge which can be removed from the module and replaced by another having a different set of lenses with different spacing. The z-axis positions of lenses 38 and 42 in module 48 are fixed, as, of course, is the position of window 40. Lens 42 can be mounted on a drawer that can be removed from the module and replaced by another with a lens of different power. One example of the cartridge and drawer arrangements and a modular assembly is described in detail further hereinbelow.

In an example of apparatus 50 for providing a line of radiation having a length L of about 6.0 mm, diode-laser array spacing P is about 24.0 mm; lenses 32 each have a radius of curvature of −12.0 mm; lenses 34 have a radius of curvature of +22.5 mm; and the spacing S is set to 16.0 mm. The entrance surface of lens 38 has a radius of curvature of 160.0 mm defining a working distance of about 325.0 mm. The line length is independent of the fast-axis negative power of lens 42.

FIG. 6 is a slow-axis view schematically illustrating another example of 50A of modular apparatus 50. This example is arranged to provide a line length of about 5.0 mm. This is achieved by increasing spacing S of example 50 to a longer spacing $S_A$. Lenses 32 each have a radius of curvature of −12.0 mm; lenses 34 have a radius of curvature of +27.0 mm. Spacing $S_A$ is 26.6 mm. Diode-laser array spacing P is about 24.0 mm.

FIG. 7 is a slow-axis view schematically illustrating yet another example of 50B of modular apparatus 50. This example is arranged to provide a line length of about 4.0 mm. This is achieved by increasing spacing of lenses 32 and 34 to a spacing $S_B$ longer than spacing $S_A$. Lenses 32 each have a radius of curvature of −12.0 mm; lenses 34 have a radius of curvature of +32.0 mm. Spacing $S_B$ is 37.0 mm. Diode-laser array spacing P is about 24.0 mm.

In apparatus 50B, diverging beams lenses 32 essentially fill the entire aperture of corresponding lenses 34. In order to provide larger slow-axis expanded beams for a smaller line length it would be necessary to increase the aperture of the lenses which would not be possible using three diode-laser bar stacks without changing module dimensions and diode-laser bar stack spacing.

FIG. 8 is a slow-axis view schematically illustrating still yet another example of 50C of modular apparatus 50. This example is arranged to provide a line length of about 3.0 mm. The central diode-laser bar stack of above described examples is omitted leaving the extreme two stacks at the fixed spacing P of about 48.0 mm. The central beam-expander is correspondingly omitted. This allows the aperture of the remaining lenses 34 and the spacing between lenses 32 and 34 to be increased to provide larger beams at lens 38. In this example, the lenses are spaced by a distance $S_C$ equal to about 57.0 mm. Lenses 32 each have a radius of curvature of −12.0 mm; lenses 34 have a radius of curvature of +41.9 mm.

Figure 9:
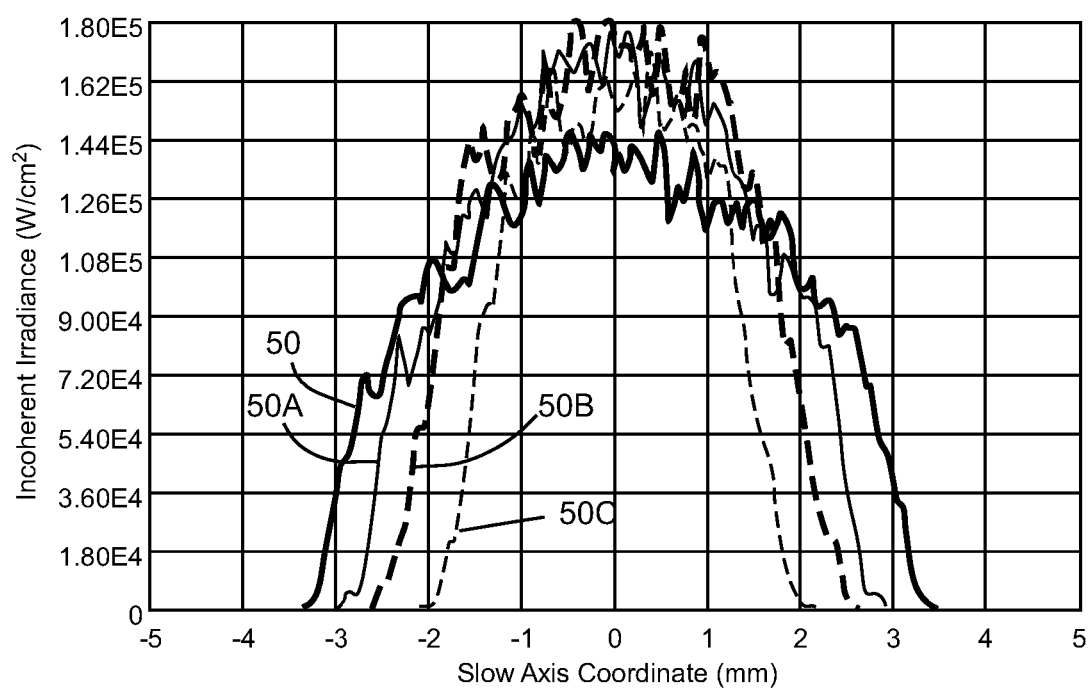
FIG. 9 is a graph schematically illustrating calculated irradiance in the working plane as a function of slow-axis coordinate for the apparatuses of FIGS. 5, 6, 7, and 8.

FIG. 9 is a graph schematically illustrating computed irradiance in the working plane as a function of slow-axis coordinate for the examples of apparatuses 50, 50A, 50B, and 50C of FIGS. 5, 6, 7, and 8, respectively. It can be seen that there is only a minor reduction in peak irradiance in the case of two-stack apparatus 50C compared with that of three-stack apparatus 50B because of the reduction in the line length.

FIG. 10A and FIG. 10B are respectively slow-axis and fast-axis views schematically illustrating a variation 50D of above described apparatus 50 configured to project an about square spot 14S of radiation in working plane 15 rather than a line of radiation. The slow-axis dimension and fast-axis dimensions of the spot are about equal. FIG. 10A has the same configuration as the example of the apparatus of FIG. 5 for providing a 6.0-mm slow-axis dimension. A 6.0-mm fast-axis dimension is achieved by providing a radius of curvature of about −1100 mm on the entrance face of fast-axis cylindrical lens 42.

Figure 11A:
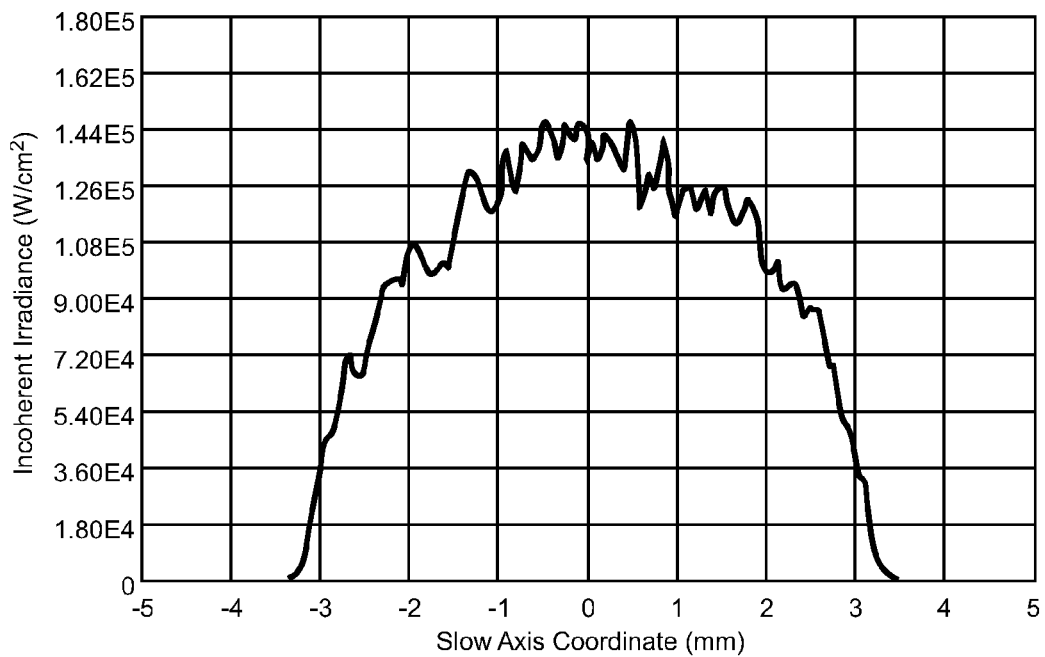
FIG. 11A and FIG. 11B are graphs schematically illustrating calculated irradiance in the working plane as a function of respectively slow-axis and fast-axis coordinates in the apparatus of FIGS. 10A and 10B.
Figure 11B:
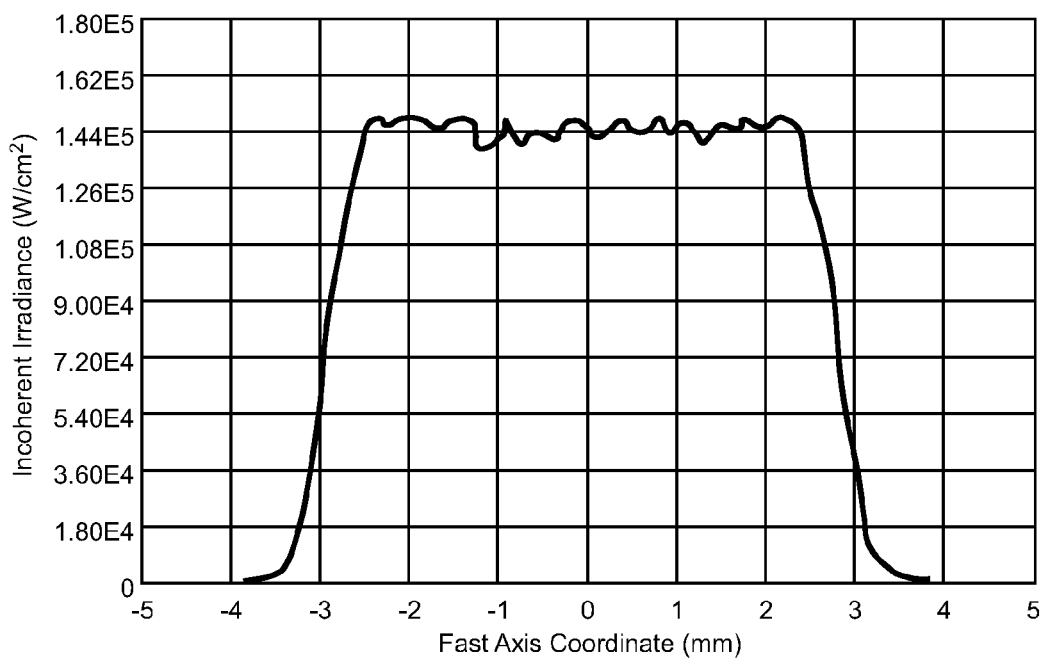

FIG. 11A and FIG. 11B are graphs schematically illustrating calculated irradiance as a function of respectively slow-axis and fast-axis coordinates for the example of the apparatus of FIGS. 10A and 10B. Calculated contour graphs (not shown) indicate that the beam cross section is about square. It can be seen however there is some difference in irradiance uniformity between the fast-axis and slow-axis directions above the 50% peak irradiance level.

From the description provided above with reference to FIGS. 5-6 and 10A-B, those skilled in the art will recognize, without further detail description, that an apparatus in accordance with the present invention may be reconfigured to provide a beam-cross section in the working plane having any length between about 3.0 mm and 6.0 mm and any width between about 1.0 mm and about 6.0 mm. This is possible without changing the working distance of the apparatus or the spacing between the diode-laser bar stacks and the focusing lens, by selecting appropriate curvature and spacing of elements of the inverse Galilean beam-expanders and an appropriate curvature of fast-axis cylindrical lens 42.

Figure 12:
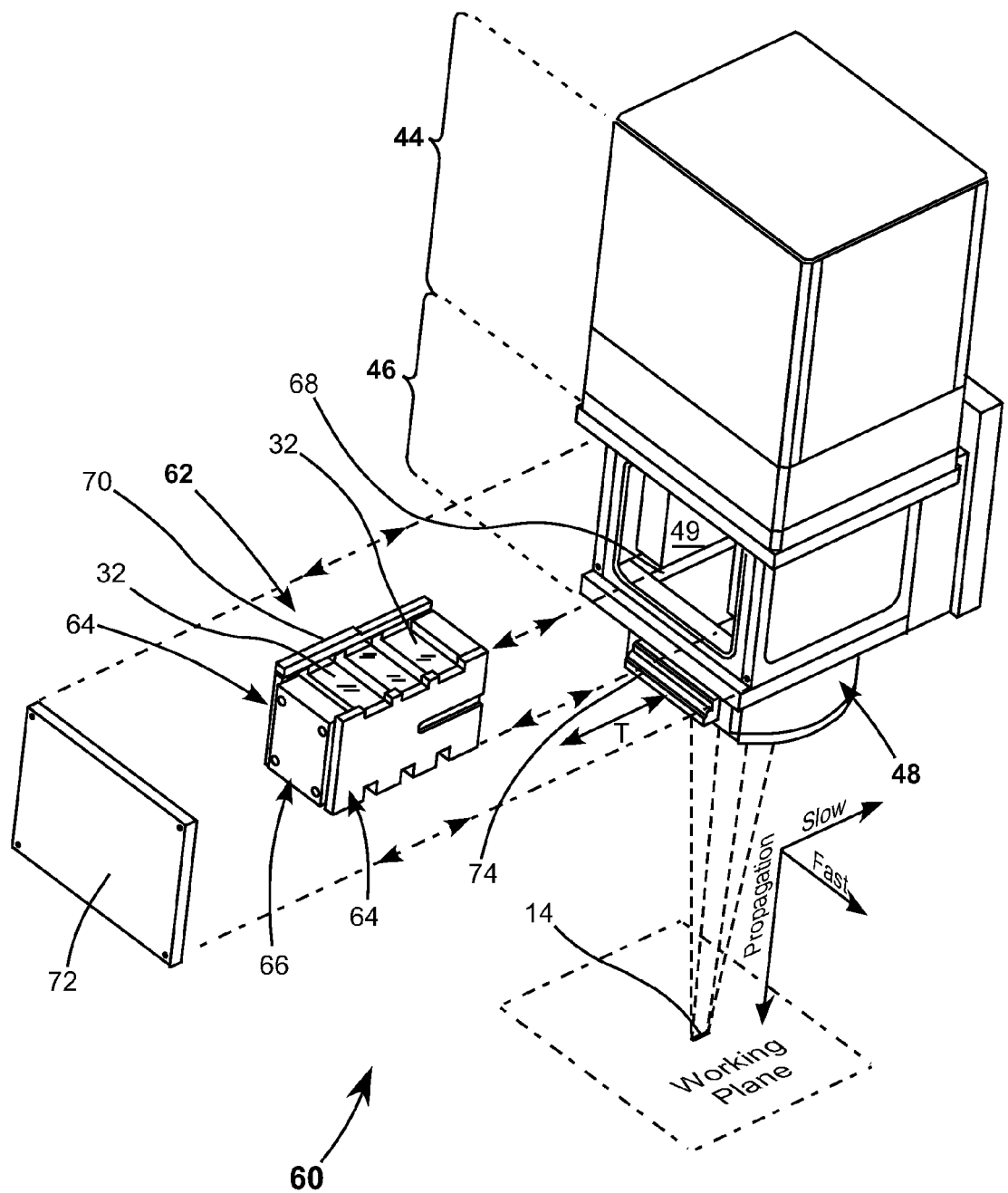
FIG. 12 is an exploded isometric view schematically illustrating mechanical details of a modular layout concept for the apparatuses of FIGS. 5, 6, 7, 8, and 10A-B with the second module including an interchangeable cartridge holding the inverse Galilean beam-expanders, and the third module including a removable and replaceable drawer for interchanging the cylindrical negative lens.
Figure 12A:
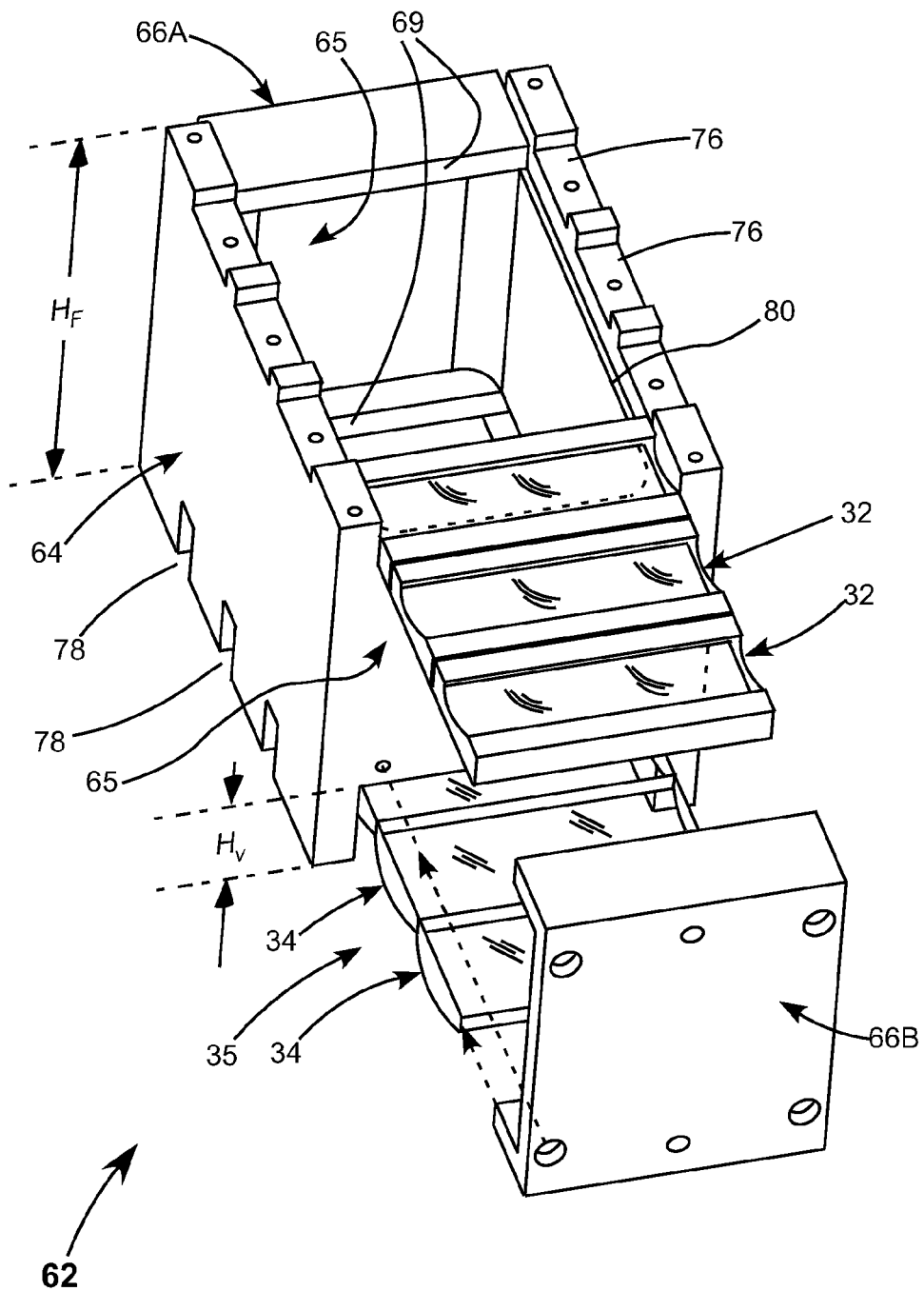
FIG. 12A is an exploded isometric view schematically illustrating further mechanical details of the inverse Galilean beam-expander cartridge of FIG. 12.

Set forth below with reference to FIG. 12 and FIG. 12A is a description of a mechanical assembly concept for facilitating such reconfiguration. This concept certainly simplifies a manufacturer's task in providing a particular beam cross-section for a particular user. The concept also makes it possible for a user to effect a reconfiguration without assistance from the manufacture.

FIG. 12 is an isometric view schematically illustrating mechanical details of a contemplated modular layout arrangement 60 for the apparatuses of FIGS. 5, 6, 7, 8, and 10A-B. Three modules 44, 46, and 48 are designated by the same reference numerals applied to schematically depicted modules in above-referenced drawings, are configured to carry the same optical elements. Water-cooling and electrical connections to module 44 for the diode-laser bar stacks are not shown for simplicity of illustration. In an apparatus configured for a laser cladding operation, there would be an additional module attached to module 48 between the module and the working plane in which line 14 is projected. This additional module (not shown) would carry powder-spray ducts and the like for the laser-cladding process.

In apparatus 60, negative lenses 32 and positive lenses 34 (not visible in FIG. 12) of the inverse Galilean beam-expanders are mounted on a cartridge 62 including a frame having side walls 64, to which the lenses are secured and end plates 66 for aligning the lenses before the lenses are secured. Cartridge 62 can be inserted into and removed from module 46 via an aperture 49 therein. When inserted into the module, the cartridge is seated on ledges 68 in the module and retained against the rails via spring pressure from springs 70 (only one thereof depicted in FIG. 12). A cover plate 72 is provided for covering the aperture in the module when the cartridge is inserted. A drawer or tray 74 is provided in focusing-and-negative lens module 48 for removing one fast-axis negative lens and replacing that lens with another having different fast-axis power. Drawer 74 is removable and replaceable into the module as indicated by arrows T.

FIG. 12A is an isometric view schematically illustrating further mechanical details of the beam-expander cartridge of FIG. 12. The cartridge includes a rectangular frame having sidewalls 64 and end-walls 65. Plano-concave negative lenses 32 are arranged with concave surfaces facing outward, as depicted, and plane surfaces supported on a ledge 80 on each of the sidewalls (only one ledge is visible because of the aspect of the drawing). Plano-convex lenses 34 in an array thereof 35 are supported, with convex surfaces facing outward, on similar ledges (not visible).

The lenses are retained on the ledges by spring clips (not shown) attached to notches 76 and 78 in the sidewalls. The total height $H_F$ of any cartridge is always nominally the same in order to allow each cartridge to fit properly in module 46. Selective differences in lens-spacing are provided by selectively varying the height $H_V$ (above the bottom of the sidewalls) of the ridges on which lenses 34 are retained. Notches 78 also have a height H. Edges 69 of an end cap 66A form a reference plane for alignment of the lenses and lenses array. The lenses 32 and lens array are held in contact with those edges by spring pressure applied by means of an opposite end cap 66B.

Recapitulating here, the invention described above is directed to apparatus projecting from a plurality of fast-axis diode-laser bar stacks a rectangular patch of radiation having a predetermined length and width. In a preferred embodiment of the invention, the apparatus is modular in form and can be relatively simply reconfigured by a user for varying the height and width of the beam and even the power density delivered into the beam. The apparatus, however, is not limited to the preferred or any other embodiment described and depicted herein. Rather the invention is limited only by the claims appended hereto.

What is claimed is:

1. Optical apparatus for projecting radiation into a spot of predetermined length and width in a working plane, the apparatus comprising:

a plurality of stacks of diode-laser bars, each stack arranged to provide a beam of laser radiation, the diode-laser bars having a length, a slow-axis aligned with the length, a fast-axis perpendicular to the slow-axis, and a propagation-axis perpendicular to the fast-axis and the slow-axis, the diode-laser bars in each stack thereof being arranged one above another in the fast-axis direction, with the diode-laser bar stacks spaced-apart and aligned in the slow-axis direction;

a corresponding plurality of beam-expanders, one for each of the diode-laser bar stacks, each of the beam-expanders arranged to expand the beam from the corresponding diode-laser bar stack in the slow-axis direction only; and an optical arrangement, including a spherical focusing lens, arranged to collect the slow-axis expanded beams and project the slow-axis expanded beams into the working plane in the slow-axis to form the length of radiation spot.

2. The apparatus of claim 1, wherein the optical arrangement focuses the slow-axis expanded beams in the fast-axis about in the working plane to form the width of the radiation spot.

3. The apparatus of claim 2, wherein the beam-expanders are configured cooperative with the optical arrangement such that the slow-axis expanded beams are each brought to intermediate foci about aligned in the slow-axis in an intermediate plane between the focusing lens and the working plane and then diverge to spread and overlap each other in the working plane to form the length of the radiation spot.

4. The apparatus of claim 1, wherein the beam-expanders are configured cooperative with the optical arrangement such that the slow-axis expanded beams are focused, in the slow-axis, overlapping, about in the working plane.

5. The apparatus of claim 4, wherein the optical arrangement projects the slow-axis expanded beams in the fast-axis into the working plane to form the width of the radiation spot.

6. The apparatus of claim 5, wherein the optical arrangement further includes a cylindrical lens having optical power in the fast-axis only, the fast axis-power being selected to locate the fast-axis focal plane of the optical arrangement at a distance from the working plane, with the width of radiation spot being dependent on that distance.

7. The apparatus of claim 6, wherein the fast-axis power of the cylindrical lens is negative power and the fast-axis focal plane is located beyond the working plane in the propagation-axis direction.

8. The apparatus of claim 5, further including first, second, and third modules, and wherein the diode-laser bar stacks are located in the first module, the beam-expanders are locate in the second module, and the optical arrangement is located in the third module and wherein the beam expanders are mounted in a cartridge removable from and replaceable into the second module.

9. The apparatus of claim 8, wherein the optical arrangement further includes a cylindrical lens having optical power in the fast-axis only, the fast axis-power being selected to locate the fast-axis focal plane at a distance from the working plane with the width of radiation spot being dependent on the distance, and wherein the fast-axis cylindrical lens is mounted on a tray removable from and replaceable into the third module.

10. Optical apparatus for projecting radiation into a spot of predetermined length and width in a working plane, the apparatus comprising:
  a plurality of stacks of diode-laser bars, each stack arranged to provide a beam of laser radiation, the diode-laser bars having a length, a slow-axis aligned with the length, a fast-axis perpendicular to the slow-axis, and a propagation-axis perpendicular to the fast-axis and the slow-axis, and the diode-laser bars in each stack thereof being arranged one above another in the fast-axis direction, with the diode-laser bar stacks spaced-apart and aligned in the slow-axis direction;
  a corresponding plurality of beam-expanders, one for each of the diode-laser bar stacks, each of the beam-expanders arranged to expand the beam from the corresponding diode-laser bar stack in the slow-axis direction only;
  a spherical focusing lens, arranged to collect the slow-axis expanded beams and project the slow-axis expanded beams into the working plane in the slow-axis to form the length of radiation spot; and
  wherein the beam-expanders are configured cooperative with the spherical focusing lens such that the slow-axis expanded beams are each brought to intermediate foci in the slow axis spaced apart and aligned in the slow-axis in an intermediate plane between the focusing lens and the working plane and then diverge to spread and overlap each other in the working plane in the slow-axis to form the length of the radiation spot.

11. The apparatus of claim 10, wherein the spherical focusing lens focuses the slow-axis expanded beams in the fast-axis about in the working plane to form the width of the radiation spot.

12. The apparatus of claim 11, wherein there are 6 diode-laser bar stacks and 6 beam expanders.

13. The apparatus of claim 1 wherein the beam expanders each include a negative slow-axis cylindrical lens followed by a positive slow-axis cylindrical lens.

14. Optical apparatus for projecting radiation into a spot of predetermined length and width in a working plane, the apparatus comprising:
  a plurality of stacks of diode-laser bars, each stack arranged to provide a beam of laser radiation, the diode-laser bars having a length, a slow-axis aligned with the length, a fast-axis perpendicular to the slow-axis, and a propagation-axis perpendicular to the fast-axis and the slow-axis, and the diode-laser bars in each stack thereof being arranged one above another in the fast-axis direction, with the diode-laser bar stacks spaced-apart and aligned in the slow-axis direction;
  a corresponding plurality of beam-expanders, one for each of the diode-laser bar stacks, each of the beam-expanders arranged to expand the beam from the corresponding diode-laser bar stack in the slow-axis direction only;
  an optical arrangement, including a spherical focusing lens, arranged to collect the slow-axis expanded beams and project the slow-axis expanded beams into the working plane in the slow-axis to form the length of radiation spot; and
  wherein the beam-expanders are configured cooperative with the optical arrangement such that the slow-axis expanded beams are each brought to a focus in the slow-axis overlapping each other about in the working plane in the slow-axis to form the length of the radiation spot.

15. The apparatus of claim 14, wherein the optical arrangement projects the slow-axis expanded beams in the fast-axis about in the working plane to form the width of the radiation spot.

16. The apparatus of claim 15, wherein the optical arrangement further includes a cylindrical lens having optical power in the fast-axis only, the fast axis-power being selected to locate the fast-axis focal plane of the optical arrangement at a distance from the working plane with the width of radiation spot being dependent on that distance.

17. The apparatus of claim 16, wherein the fast-axis power of the cylindrical lens is negative power and the fast-axis focal plane is located beyond the working plane in the propagation-axis direction.

18. The apparatus of claim 14, further including first, second, and third modules, and wherein the diode-laser bar stacks are located in the first module, the beam-expanders are locate in the second module, and the optical arrangement is located in the third module, with the beam-expanders in the second module being mounted on a cartridge slidably removable from and insertable into the second module.

* * * * *